United States Patent
Bang et al.

(10) Patent No.: US 6,813,195 B2
(45) Date of Patent: Nov. 2, 2004

(54) PIPE LATCH CIRCUIT FOR OUTPUTTING DATA WITH HIGH SPEED

(75) Inventors: Jeong-Ho Bang, Ichon-shi (KR); Ki-Jun Nam, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/620,901

(22) Filed: Jul. 16, 2003

(65) Prior Publication Data

US 2004/0095178 A1 May 20, 2004

(30) Foreign Application Priority Data

Nov. 20, 2002 (KR) .................................. 10-2002-0072262

(51) Int. Cl.$^7$ .............................................. G11C 11/00
(52) U.S. Cl. ............................ 365/189.12; 365/189.02; 365/233
(58) Field of Search ........................ 365/189.12, 189.02, 365/189.05, 233, 221

(56) References Cited

U.S. PATENT DOCUMENTS

| | | | |
|---|---|---|---|
| 5,465,334 A | * | 11/1995 | Sato .......................... 712/32 |
| 5,892,730 A | | 4/1999 | Sato et al. |
| 6,262,938 B1 | | 7/2001 | Lee et al. |
| 6,353,574 B1 | | 3/2002 | Shim |
| 6,392,909 B1 | | 5/2002 | Jang et al. |
| 6,552,955 B1 | | 4/2003 | Miki |
| 6,564,287 B1 | | 5/2003 | Lee |
| 2002/0074961 A1 | | 6/2002 | Ziegenhorn et al. |
| 2003/0081491 A1 | | 5/2003 | Miki |

FOREIGN PATENT DOCUMENTS

| | | |
|---|---|---|
| JP | 2000-276877 | 10/2000 |
| JP | 2001-035155 | 2/2001 |
| JP | 2002-133866 | 5/2002 |

* cited by examiner

Primary Examiner—Son T. Dinh
(74) Attorney, Agent, or Firm—Blakely Sokoloff Taylor & Zafman

(57) ABSTRACT

It is an objective of the present invention to provide a pipe latch circuit with simpler control, smaller footprint, and higher speed operation. For this purpose, the present invention provides a pipe latch circuit for storing a sequentially received plurality of first data and second data and outputting them as rising edge output data or falling edge output data.

6 Claims, 15 Drawing Sheets

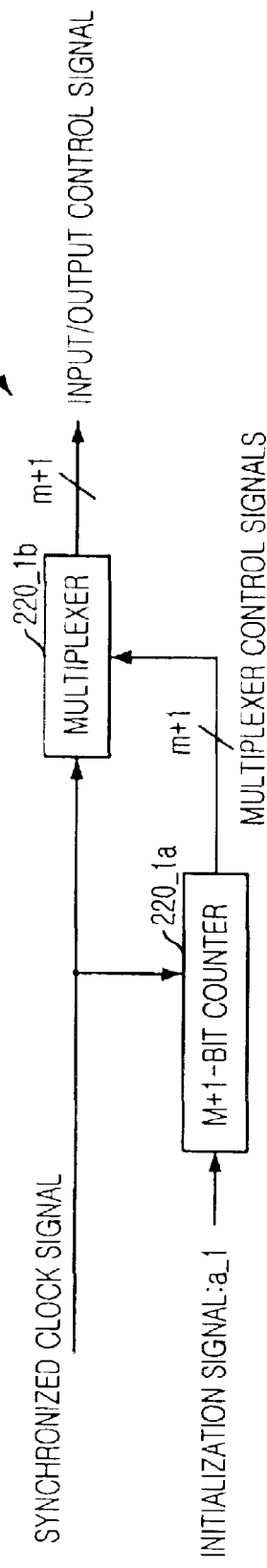
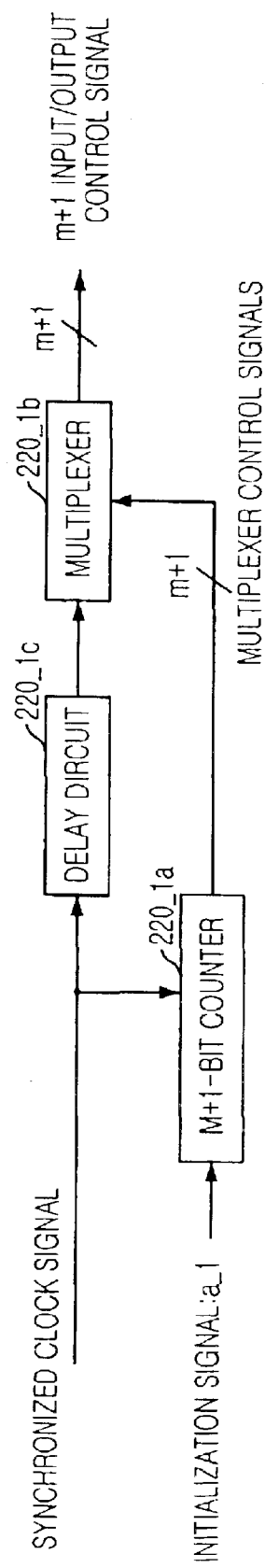

FIG. 9

|  | CONVENTIONAL PIPE LATCHES ||  PIPE LATCHES ACCORDING TO THE PRESENT INVENTION |
|---|---|---|---|
|  | PARALLEL | SERIAL |  |
| REGISTER | 2n(16) | 2n(16) | 2n(16) |
| MULTIPLEXER | n(8) | 1(1) | 1(1) |
| PATH CIRCUIT | 4n(32) | 2n−2(14) | (2n−4)+2k(18) |
| TOTAL | 7n(56) | 4n−1(31) | (4n−3)+2k(35) |
| CONTROL SIGNAL | 4n(40) | 2n−2(16) | (2n−4)+2k(18) |

PIPE LATCH CIRCUIT FOR OUTPUTTING DATA WITH HIGH SPEED

FIELD OF THE INVENTION

The present invention relates to semiconductor memory devices. More particularly, the invention relates to a pipe latch circuit that receives input data from the cell area, latches the data, and outputs the data as output to external circuitry.

DESCRIPTION OF THE PRIOR ART

In general, a synchronous memory device requires a pipe latch circuit for continuous data output. A pipe latch circuit stores the data received from the cell area and sequentially outputs them according to the synchronization signals from a clock. A pipe latch circuit controller is used to control this pipe latch circuit. A pipe latch circuit controller is a device that provides control for sequentially storing the data received from the cell area according to the synchronization signals from a clock and outputting them.

FIG. 1 is a block diagram of a typical DDR (Double Data Rate) Synchronous memory device.

In FIG. 1, the DDR Synchronous memory device comprises a row address input 400 for receiving, decoding and outputting row addresses, a column address input 300 for receiving, decoding, and outputting column addresses, a cell area 500 for outputting data according to the signals from the row address input 400 and column address input 300, an instruction interpreter 600 for receiving and decoding clock signals and instruction signals, a pipe latch circuit 100 for sequentially receiving data output from the cell area 500 and outputting to the output buffer, a pipe latch circuit controller 200 for controlling the pipe latch circuit 100 according to the signals received from the instruction interpreter 600 and the clock, and an output buffer 700 for receiving and outputting the outputs from the pipe latch circuit 100 as output data to external circuits.

In DDR memory devices where data is outputted on rising edges as well as falling edges, the pipe latch circuit receives even-numbered data and odd-numbered data from the cell area 500 separately, and sends them to the output buffer 700 as rising edge data and falling edge data, respectively. The even-numbered data and odd-numbered data are received from the cell area 500 by the pipe latch circuit 100, and outputted in synchronization with the rising edges and falling edges of external clock signals.

Meanwhile, the pipe latch circuit 100 comprises a plurality of registers whose number depend on the number of data to be received and latched, and the CAS latency of the memory device. Also, there are serial pipe latch circuits which use registers in series, and parallel pipe circuits which use registers in parallel.

FIG. 2A is a block diagram of a parallel pipe latch circuit comprising registers in parallel, according to the prior art.

With reference to the FIG. 2A, the pipe latch circuit 100a comprises a plurality of registers connected in parallel 100a for receiving even-numbered data, a plurality of registers connected in parallel 20'_1, 20'_2, ..., 20'_n for receiving odd-numbered data, a plurality of path circuits 10_1, 10_2, ..., 10_n provided at the stage preceding the registers 20_1, 20_2, ..., 20_n, 20'_1, 20'_2, ..., 20'_n for storing the received even-numbered data into the registers 20_1, 20_2, ..., 20_n in response to n even-numbered input control signals (1~n), a plurality of path circuits 10'_1, 10'_2, ..., 10'_n provided at the stage preceding the registers 20_1, 20_2, ..., 20_n, 20'_1, 20'_2, ..., 20'_n for storing the received even-numbered data into the registers 20'_1, 20'_2, ..., 20'_n in response to n odd-numbered input control signals 1~n, n multiplexers 30_1~30_n for selectively outputting even-numbered data and odd-numbered data from each register 20_1, 20_2, ..., 20_n, 20'_1, 20'_2, ..., 20'_n, 2n path circuits 40_1, 40_2, 40_n, 40'_1, 40'_2, ..., 40'_n provided at the output stages of the multiplexers 30_1~30_n for outputting data from the multiplexers 30_1~30_n as rising edge data or falling edge data.

FIG. 2B is a block diagram of a pipe latch circuit controller 200a for the pipe latch circuit 100a shown on FIG. 2A.

In FIG. 2B, the pipe latch circuit controller 200a receives clock signals and data output timing control signals, and outputs 2n output control signals and n multiplexer selection signals. The 2n control signals include n control signals for even-numbered data, and n control signals for odd-numbered data.

In the following, the operation of a parallel pipe latch circuit is explained with reference to FIG. 2A and FIG. 2B.

First, when the data from the corresponding read addresses are sent from the cell area to the pipe latch circuit 100a, the 2n path circuits 10_1, 10_2, ..., 10_n, 10'_1, 10'_2, ..., 10'_n are sequentially turned on, in response to the n even-numbered input control signals 1~n and n odd-numbered input control signals 1~n. As the path circuits are turned on, the even-numbered data and odd-numbered signals are sequentially stored in the registers 20_1, 20_2, ..., 20_n, 20'_1, 20'_2, ..., 20'_n.

Subsequently, the n multiplexers 30_1, 30_2, ..., 30_n output data from the registers 20_1, 20_2, ..., 20_n, 20'_1, 20'_2, ..., 20'_n as rising edge data or falling edge data selectively.

Subsequently, the n odd-numbered output control signals (1~n) and n even-numbered output control signals (1~n) from the pipe latch circuit controller (200a) selectively turn on the path circuits 40_1, 40_2, ..., 40_n, 40'_1, 40'_2, ..., 40'_n, causing the output data from the n multiplexers 1~n passed to the output buffer (ref. 700 FIG. 1).

The above described parallel pipe latch circuit 100a has the advantage of outputting data in high speed, because input data is latched only once and outputted in response to the output control signals. However, the parallel pipe latch circuit 200a has a disadvantage in that the pipe latch circuit controller 200a becomes complex because it has to generate and output input control signals and output control signals separately.

For example, if we implement the pipe latch circuit using 16 registers, the controller is required to generate 16 input control signals (8 for even-numbered input control signals and 8 for odd-numbered input control signals) and 16 output control signals (8 for even-numbered output control signals and 8 for odd-numbered output control signals) each with different timing. Also, in this case, the parallel pipe latch circuit requires 8 multiplexers. The multiplexers require large footprint, so a parallel pipe latch circuit having a plurality of multiplexers requires large sized integrated circuit chip.

In order to solve the problem, a serial pipe latch circuit consisting of a plurality of registers connected in series is sometimes used because of its smaller footprint and simpler control structure.

FIG. 3 is a block diagram of a serial pipe latch circuit 100b consisting of registers connected in series and a pipe latch circuit controller 200b.

In FIG. 3, the serial pipe latch circuit 100b comprises a plurality of registers 50_1, 50_2, ..., 50_n connected in series for receiving even-numbered data and delivering them sequentially, a plurality of path circuits 60_1, ..., 60_n-1 provided between the registers 50_1, 50_2, ..., 50_n for delivering the data to the registers at the next stage, a plurality of registers 50'_1, 50'_2, ..., 50'_n connected in series for receiving odd-numbered data and delivering them sequentially, a plurality of path circuits 60'_1, ..., 60'_n-1 provided between the registers 50'_1, 50'_2, ..., 50'_n for delivering the data to the registers at the next stage, and a multiplexer 60a for selectively outputting the data stored in the $n^{th}$ registers 50_n, 50'_n as rising edge data and falling edge data.

Also, the pipe latch circuit controller 200b receives clock signals and data output timing control signals, and outputs 2(n-1) input and output control signals, an output control signal, and a multiplexer selection signal.

The following is a description for the operation of serial pipe latch circuit 100b, with reference to FIG. 3.

First, when the addresses are given, the corresponding even-numbered data and odd-numbered data are sequentially read from the cell area into the pipe latch circuit 100b, and sequentially stored in the even-numbered data registers 50_1, 50_2, ..., 50_n and the odd-numbered data registers 50'_1, 50'_2, ..., 50'_n. At this time the pipe latch circuit controller 200b outputs n-1 even-numbered input/output control signals 1~n-1 and n-1 odd-numbered input/output control signals 1~n-1 to turn on path circuits 60_1, 60_2, ..., 60_n-1, 60'_1, 60'_2, ..., 60'_n-1 sequentially, so that even-numbered data and odd-numbered data are sequentially stored in the registers 50_1, 50_2, ..., 50_n, 50'_1, 50'_2, ..., 50'_n.

Subsequently, in response to the selection signals from the pipe latch circuit controller 200b to the multiplexer 60a, the data stored in the registers at the final stages 50_n, 50'_n are selected as rising edge data and falling edge data, and are outputted to the output buffer (ref. 700 in FIG. 1) in response to the output control signals.

Compared to the parallel pipe latch circuit, the serial pipe latch circuit has the advantage of simpler pipe latch circuit controller because the data input to the registers and the data output are controlled by the input/output signals at the same time.

As an example, a serial pipe latch circuit 100b using 16 registers will require only 14 input/output control signals. A parallel pipe latch circuit 100a requires a total of 40 control signals (16 input control signals, 16 output control signals, and 8 multiplexer control signals), while the serial pipe latch circuit requires only 16 control signals (14 input/output control signals, 1 selection signal, 1 output control signal). Therefore, the serial pipe latch circuit 100b has the advantage of simpler control than the parallel pipe latch circuit 100a.

Also, since the serial pipe latch circuit 100b requries only one multiplexer at the final output registers, it has the advantage of far smaller footprint compared to the parallelpipe latch circuit 100a. Because the multiplexers require larger footprint than registers, with less multiplexers, the circuitry footprint is greatly reduced.

However, the serial pipe latch circuit 100b has a considerable limitation in high speed data output because the registers are connected in series from the input to the output, and are sequentially controlled. That is, only when the currently stored data is passed to the next stage register, can a new data be received.

In conclusion, the serial pipe latch circuit 100b is advantageous because of the smaller footprint in the integrated circuitry and simpler control signal generation method, but is very limited in high speed operation. Therefore, as high speed operation of memory devices are more and more in demand, there is a necessity for a pipe latch circuit that has a simple control method and at the same time can operate in high speed.

SUMMARY OF THE INVENTION

It is, therefore, an objective of the present invention to provide a pipe latch circuit with simpler control, smaller footprint, and higher speed operation.

In accordance with an aspect of the present invention, there is provided a pipe latch circuit for storing a sequentially received plurality of first data and second data and outputting them as rising edge output data or falling edge output data, including: a first input register for receiving the first data; a plurality of first serial pipe latches comprising a plurality of registers connected in series, for selectively storing the outputs from the first input registers and selectively outputting them; a first linkage register for storing the data outputted from the plurality of first serial pipe latches; a second input register for receiving the second data; a plurality of second serial pipe latches comprising a plurality of registers connected in series, for selectively storing the outputs from the second input registers and selectively outputting them; a second linkage register for storing the data outputted from the plurality of second serial pipe latches; a multiplexer for selecting the data stored in the first linkage register and the second linkage register as the rising edge output data and the falling edge output data, and outputting them; and a pipe latch circuit controller for controlling the plurality of first and second serial pipe latches and the multiplexer.

BRIEF DESCRIPTION OF THE DRAWINGS

The above and other objects and features of the present invention will become apparent from the following description of the preferred embodiments given in conjunction with the accompanying drawings, in which:

FIG. 7 is a block diagram of an embodiment of the serial pipe latch controller shown on FIG. 6;

FIG. 8 is a block diagram of another embodiment of the serial pipe latch controller shown on FIG. 6;

FIG. 9 is a comparison of pipe latch circuits according to the prior art and according to the present invention;

DETAILED DESCRIPTION OF THE PREFERRED EMBODIMENTS

Hereinafter, in order to provide a detailed description such that those skilled in the art can easily embody the technical concept of the present invention, the most preferred embodiments of the present invention will be described in detail, referring to the accompanying drawings.

Figure 1:
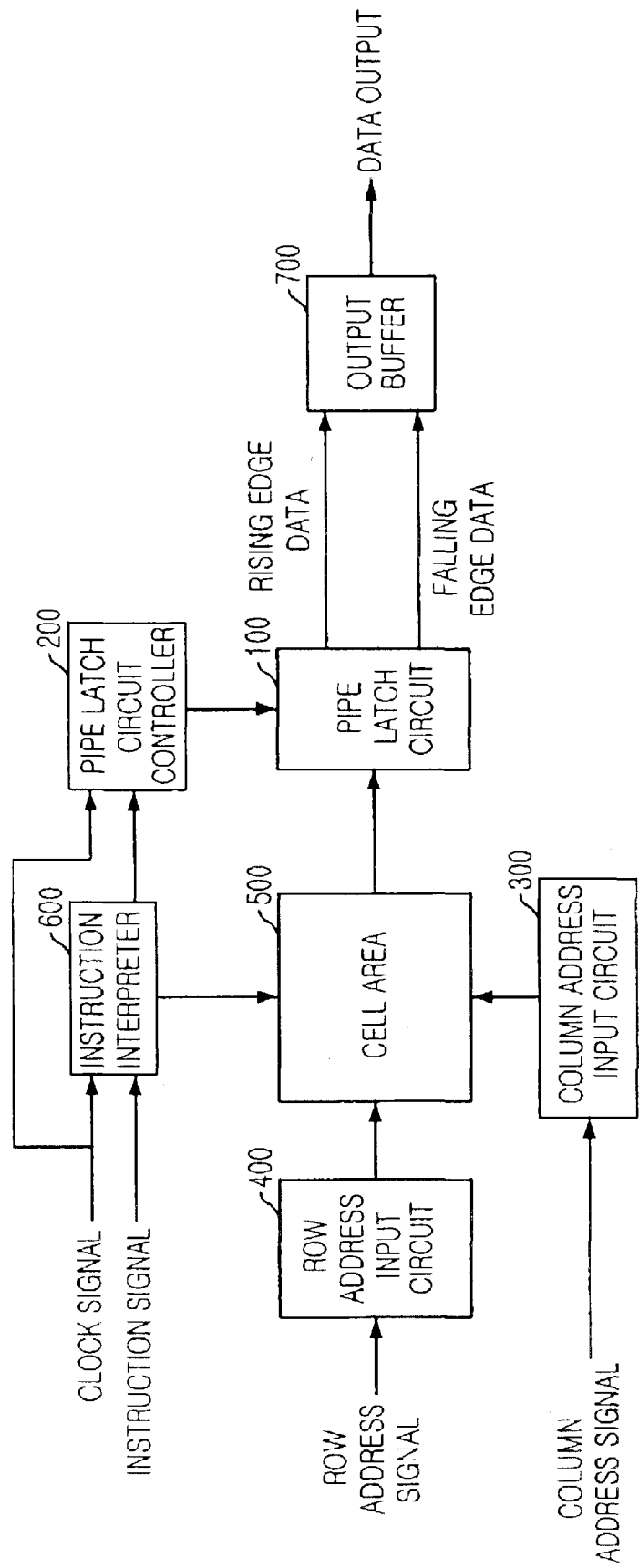
FIG. 1 is a block diagram of conventional DDR SDRAM.
Figure 2A:
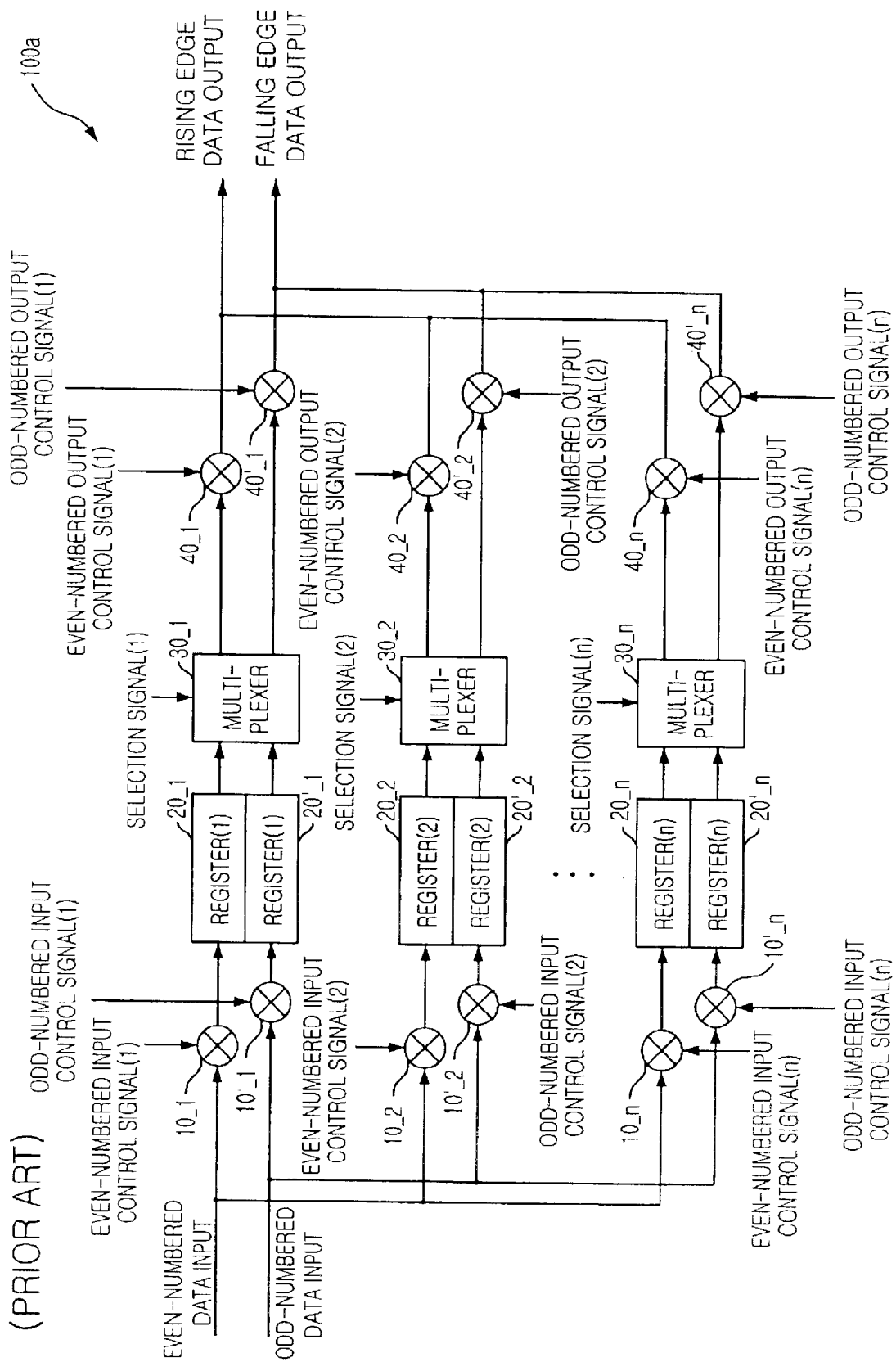
FIG. 2A is a block diagram of a pipe latch circuit using registers in parallel according to the prior art.
Figure 2B:
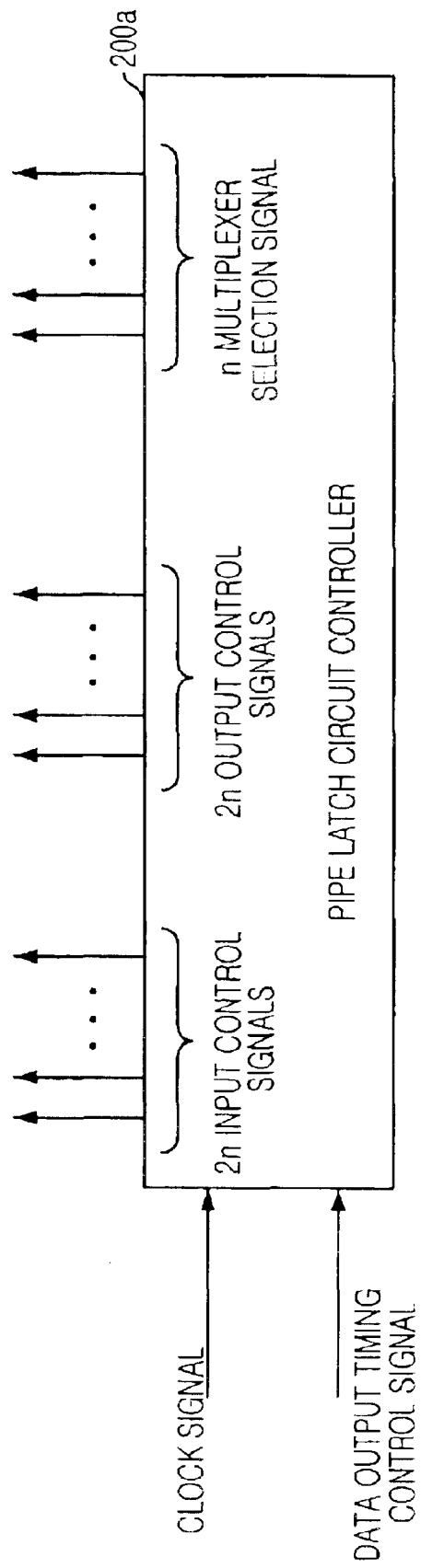
FIG. 2B is a block diagram of the pipe latch circuit controller to control the pipe latch circuit shown on FIG. 2A.
Figure 3:
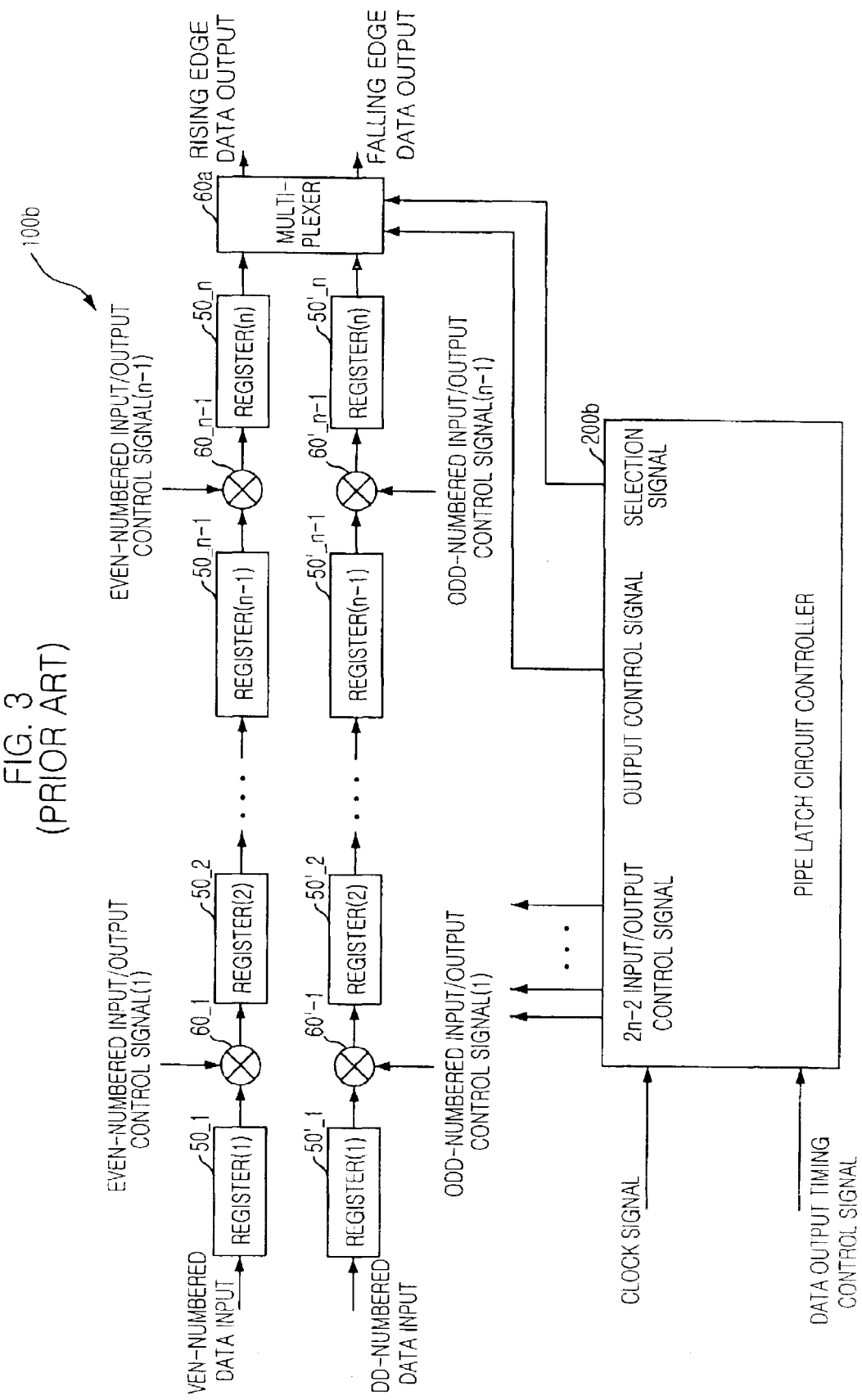
FIG. 3 is a block diagram of a pipe latch circuit and its controller using registers in series according to the prior art.
Figure 4:
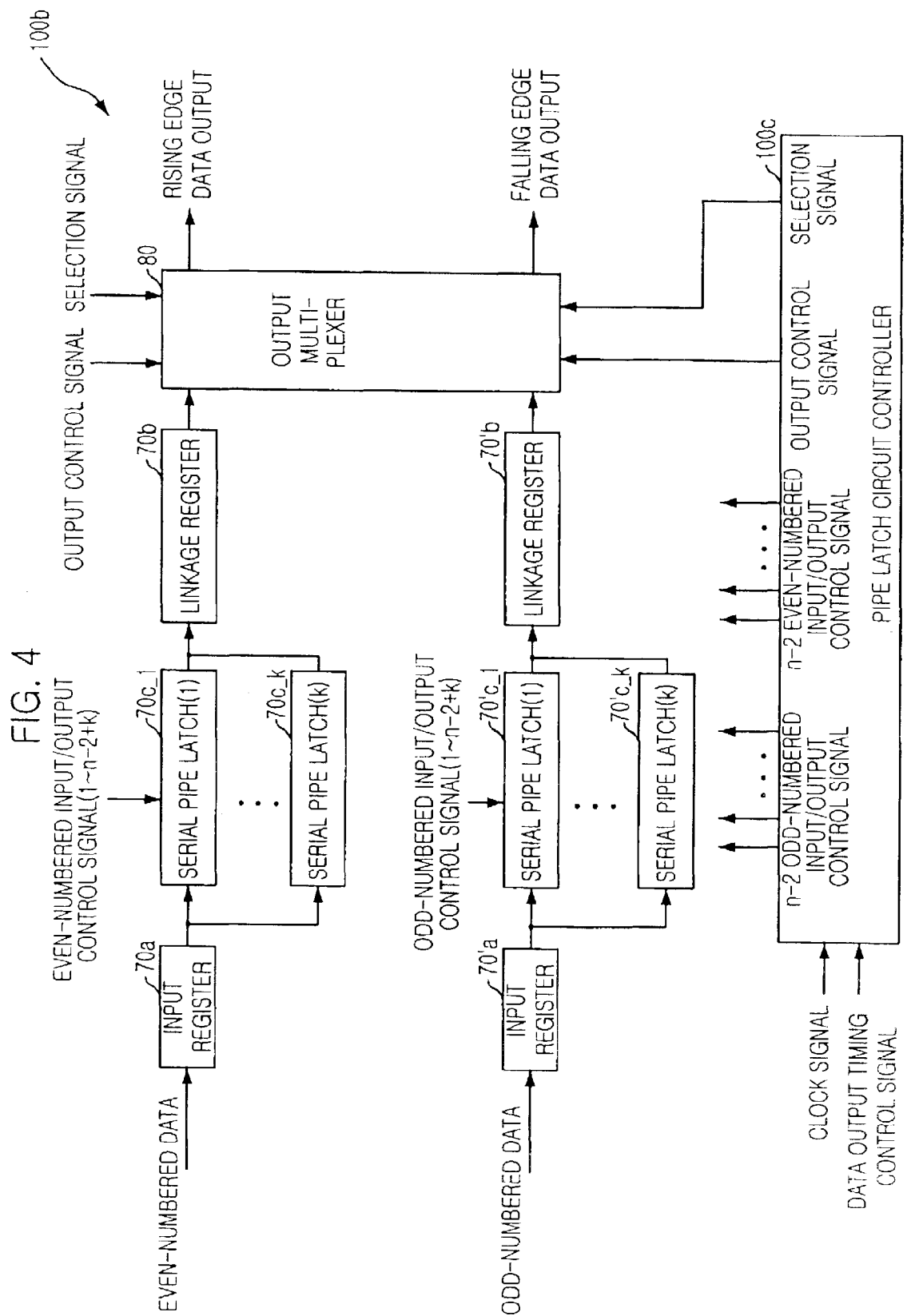
FIG. 4 is a block diagram of a pipe latch circuit according to one of the embodiments of the present invention.

FIG. 4 is a block diagram.of a pipe latch circuit according to an embodiment of the present invention.

With reference to FIG. 4, the pipe latch circuit 100c of the present embodiment comprises a first input register 70a for receiving even-numbered data, a plurality of first serial pipe latches 70c_1~70c_k comprising a plurality of registers connected in series for selectively storing the outputs from the first input register 70a and selectively outputting them, a first linkage register 70b for storing the data outputted from the plurality of first serial pipe latches 70c_1~70c_k, a second input register 70'a for receiving odd-numbered data, a plurality of second serial pipe latches 70'c_1~70'c_k comprising a plurality of registers connected in series for selectively storing the outputs from the second input register 70'a and selectively outputting them, a second linkage register 70'b for storing the data outputted from the plurality of second serial pipe latches 70'c_1~70'c_k, a multiplexer 80 for selecting the data stored in the first linkage register 70b and the second linkage register 70'b as rising edge output data or falling edge output data, and a pipe latch circuit controller 200c for controlling the plurality of first and second serial pipe latches 70c_1~70c_k, 70'c_1~70'c_k and the output multiplexer 80.

And the pipe latch circuit controller 200c receives clock signals and data output timing control signals, and outputs n–2 odd-numbered input/output control signals, n–2 even-numbered input/output control signals, an output control signal, and a multiplexer selection signal.

Figure 5:
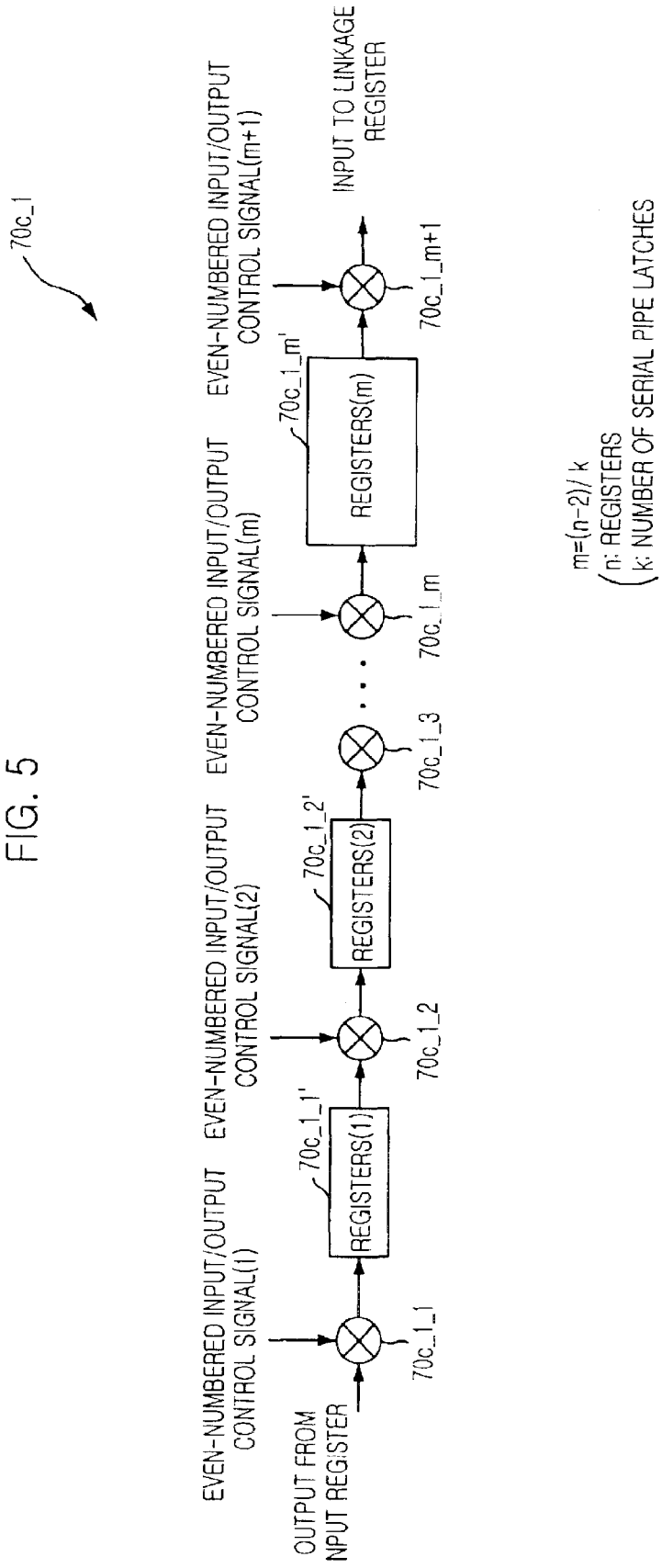
FIG. 5 is a block diagram showing an embodiment of the serial pipe latch shown on FIG. 4.

FIG. 5 is a block diagram of an embodiment of one of the serial pipe latches 70c_1~70c_k, 70'c_1~70'c_k shown on FIG. 4.

With reference to FIG. 5, the serial pipe latch (for example, 70c_1) comprises a first path circuit 70c_1_1 for delivering even-numbered data outputted from first input register 70a, a plurality of registers 70c_1_1', 70c_1_2', ..., 70c_1_m' connected in series for transporting the data received from the first path circuit sequentially, a plurality of second path circuits 70c_1_2, 70c_1_3, ..., 70c_1_m provided between the plurality of registers 70c_1_1', 70c_1_2', ..., 70c_1_m' for delivering the data stored in the register at the preceding stage to the register at the following stage, a third path circuit 70c_1_m+1 for delivering the data stored in the register at the final stage 70c_1_m' of the plurality of registers connected in series, to the first linkage register 70b. All the serial pipe latches shown on FIG. 4 70c_1~70c_k, 70'c_1~70'c_k has the same configuration as shown on FIG. 5. In FIG. 5, the number k is the number of serial pipes forming pipe latches, and the number m is the number of registers forming one serial pipe. Therefore, the number of registers forming one serial pipe (m=(n–2)/k) is obtained by a division, where the denominator n–2 is the number of registers n used in either the even-numbered data path or odd-numbered data path minus 2 (1 for input register, 1 for linkage register), and the numerator is the number of the serial pipes k.

Figure 6:
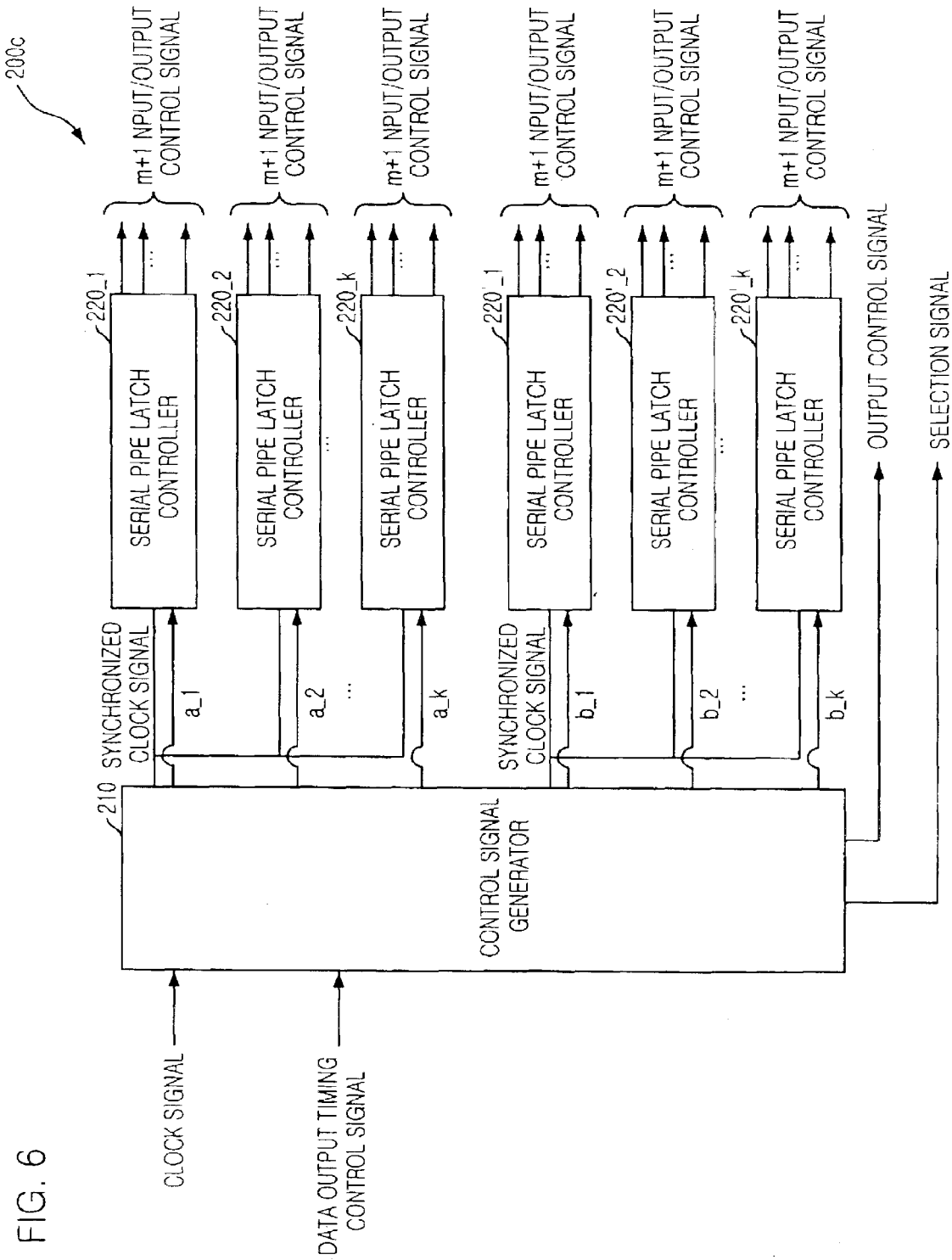
FIG. 6 is a block diagram of the pipe latch circuit controller shown on FIG. 4.

FIG. 6 is a block diagram of pipe latch-circuit controller 200c shown on FIG. 4.

In FIG. 6, the pipe latch circuit controller 200c comprises a control signal generator 210 for delivering received clock signals when enabled by data output timing control signals, and for outputting a plurality of initialization signals a_1~a_k, b_1~b_k sequentially enabled at each period of the clock signals, and a plurality of serial pipe latch controllers 220_1~220_k, 220'_1~220'_k for receiving the clock signals when enabled by one of the plurality of initialization signals a_1~a_k, b_1~b_k and for turning on first path circuits through the third path circuits provided at each of the plurality of serial pipe latches 70c_1~70c_k, 70'c_1~70'c_k.

FIG. 7 is a block diagram of an embodiment of one of the plurality of serial pipe latch controllers 220_1~220_k, 220'_1~220'_k shown on FIG. 6.

With reference to FIG. 7, the serial pipe latch controller (for example, ref. 220_1) comprises an m+1-bit counter 220_1a for counting as many m+1 of the clock signals as the number of the first path circuits through the third path circuits 70c_1_1, 70c_1_2, ..., 70c_1_m+1 provided at the serial pipe latch 70c_1 when enabled by a selected initialization signal a_1 and outputting m+1 multiplexer control signals, and a multiplexer (220_1b) for outputting m+1 input/output control signals that sequentially turn on the first path circuits through the third path circuits 70c_1_1, 70c_1_2, ..., 70c_1_m+1 provided at the serial pipe latch 70c_1.

FIG. 8 is a block diagram of the second embodiment of one of the plurality of serial pipe latch controllers 220_1~220_k, 220'_1~220'_k shown on FIG. 6.

Compared to FIG. 7, the serial pipe latch controller 220_1' shown on FIG. 8 is designed so that the clock signals from the serial pipe latch controller 220_1 to the multiplexer 220_1b are delivered through a delay circuit 220_1c. This is intended to give some tolerance to the operation timing of the m+l-bit counter 220_1a that receives clock signals. More specifically, the m+1 multiplexer control signals from the m+1-bit counter are first received by the multiplexer 220_1b and the clock signals are later received through the delay circuit 220_1c.

FIG. 9 is a comparison of the pipe latch circuits according to the prior art and the pipe latch circuits according to the present invention. With reference to FIG. 9, the number of unit components and the number of control signals will be compared hereinafter, between the pipe latch circuits according to the prior art and the pipe latch circuits according to the present invention. In FIG. 9, the numbers in the parentheses are examplary numbers from the case where a total of 16 registers are used (8 for even-numbered data registers and 8 for odd-numbered data registers). For easier understanding, the numbers in the parentheses are used in the following explanation of the comparison.

First, in the case of conventional pipe latch circuit controllers, 8 registers are used for even-numbered data path and 8 registers are used for odd-numbered data path for outputting the data as rising edge data or falling edge data. Also, 8 multiplexers are required in order to selectively output 8 even-numbered data and 8 odd-numbered data.

Also, a total of 32 path circuits are required, of which 16 are for storing input data and 16 are for outputting stored data. The number of required control signals is equal to the number of path circuits. Therefore, a total of 32 path circuit control signals are required. In addition, 8 multiplexer selection signals are required. Therefore, the parallel pipe latch circuit controller is required to generate a total of 40 input/output signals each with different timing, for outputting to the parallel pipe latch circuit.

Meanwhile, the serial pipe latch circuit requires 8 registers connected in series for sequentially receiving even-numbered data and 8 registers connected in series for sequentially receiving odd-numbered data. In this case, only one multiplexer is required because only the data in the registers at the final stages (out of the 8 registers connected in series) are outputted as rising edge data or falling edge data.

Also, a total of 14 path circuits are required (7 between the 8 registers for even-numbered data path and 7 between the 8 registers for odd-numbered data) because the path circuits are used between the registers connected in series. Therefore, a total of 16 control signals are required in a serial pipe latch circuit, i.e. 14 path circuit control signals, 1 multiplexer selection signal, and 1 output control signal.

Meanwhile, in the case of the pipe latch circuit according to the present invention, the number of control signals is decided by how many registers are used to form one serial pipe latch, out of the 16 registers. In the following, as an example, it is assumed that two registers are used in one serial pipe latch.

In the case of the pipe latch circuit according to the present invention, out of the 16 registers, two registers are used as input registers, and two registers are used as linkage registers. The rest (12 registers) are used to form 6 serial pipe latches (2 registers in each serial pipe latch). In this case, only one multiplexer is required that connects to the two linkage registers, and a total of 18 path circuits are required, 3 for each of the 6 serial pipe latches. Therefore, the pipe latch circuit controller is required to generate a total of 20 control signals only, i.e. 18 path circuit control signals, a multiplexer selection signal, and an output control signal.

Meanwhile, the path circuit, its simplest form, can be implemented by transfer gates, and the registers can be implemented by a latch having 2 inverters. The multiplexer consumes a larger footprint than a register, because it needs to select 2 received signals as rising edge data output or falling edge data output and output them.

Therefore, the pipe latch circuit according to the present invention has a greatly reduced footprint inside an integrated circuit chip compared to the parallel pipe latch circuit, because it requires only one multiplexer like the serial pipe latch circuit. Also, because the number of required control signals is greatly reduced (40 control signals for a parallel pipe latch circuit vs. 20 control signals for the pipe latch circuit according to the present invention), implementation of the pipe latch circuit controller is simplified, and operation and control is also simplified.

The pipe latch circuit according to the present invention has the above described advantages, and at the same time, has also the advantage of higher speed output than the conventional serial pipe latch circuit because the data from the input registers are selectively received by a plurality of serial pipe latches. In case of the serial pipe latch circuit, high-speed operation is not possible because new data cannot be received from the cell area until the current data stored in the registers are delivered to the register at the subsequent stage.

However, according to the present invention, new data can be read from the cell area through the input registers into other serial pipe latches even when the data in one serial pipe latch received from the cell area are not yet passed to the register at the subsequent stage, because there are a plurality of serial pipe latches available to the input registers.

In conclusion, the pipe latch according to the present invention is designed so that it has a simpler control than a parallel pipe latch circuit, and yet provides the same advantage of high-speed operation.

FIGS. 10 to 15 are the block diagrams, circuit diagrams, and waveform diagrams showing operation of the pipe latch circuit according to a preferred embodiment of the present invention comprising 16 registers.

Figure 10:
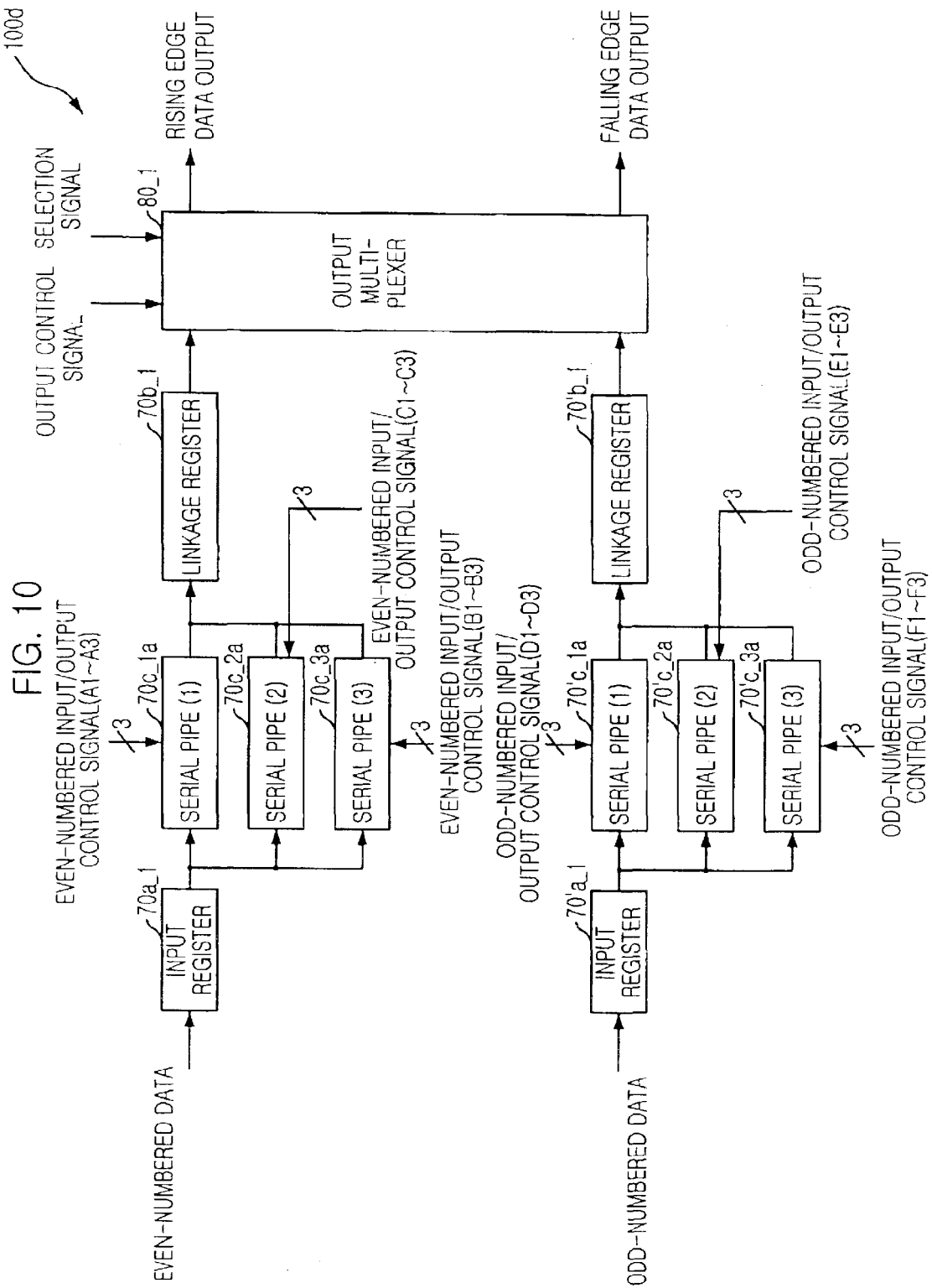
FIG. 10 is a block diagram of an embodiment of the pipe latch circuit according to the present invention, comprising 16 registers.

With reference to FIG. 10, the pipe latch circuit 100$d$ according to the present embodiment comprises a first input register 70$a\_1$ for receiving even-numbered data, 3 serial pipe latches 70$c\_1a$, 70$c\_2a$, 70$c\_3a$ each comprising 2 registers for selectively receiving the data from the first input register 70$a\_1$ and selectively outputting them, a first linkage register 70$b\_1$ for storing the data selectively outputted from the serial pipe latches 70$c\_1a$, 70$c\_2a$, 70$c\_3a$, a second input register 70'$a\_1$ for receiving odd-numbered data, 3 serial pipe latches 70'$c\_1a$, 70'$c\_2a$, 70'$c\_3a$ each comprising 2 registers for selectively receiving the data from the second input register 70'$a\_1$ and selectively outputting them, a second linkage register 70'$b\_1$ for storing the data selectively outputted from the serial pipe latches 70$c\_1a$, 70$c\_2a$, 70$c\_3a$, an output multiplexer 80$\_1$ for selecting data outputted from the first linkage register and the second linkage register 70$b\_1$, 70'$b\_1$ as rising edge output data or falling edge output data and outputting them, 6 serial pipe latches 70'$c\_1a\_$, 70'$c\_2a$, 70'$c\_3a$, 70'$c\_1a$, 70'$c\_2a$, 70'$c\_3a$, and a pipe latch circuit controller (ref. 200$d$ in FIG. 12) for controlling the output multiplexer 80.

Figure 11:
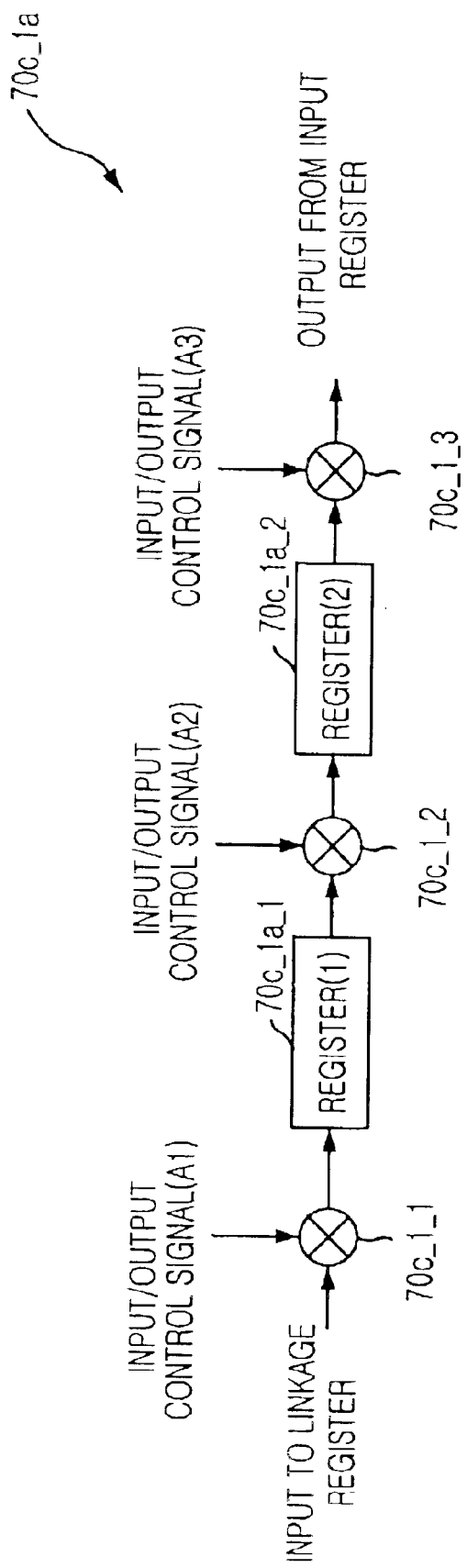
FIG. 11 is a block diagram of serial pipe latch shown on FIG. 10.

FIG. 11 is a block diagram of internals of one of the 6 serial pipe latches shown on FIG. 10.

With reference to FIG. 11, the serial pipe latch 70$c\_1a$ comprises 2 registers connected in series 70$c\_1a\_1$, 70$c\_1a\_2$, a path circuit 70$c\_1\_1$ provided at the input stage of the register 70$c\_1a\_1$, a path circuit 70$c\_1\_3$ provided at the output stage of the register 70$c\_1a\_1$, and a path circuit 70$c\_1\_2$ provided between the 2 registers 70$c\_1a\_1$, 70$c\_1a\_2$.

Figure 12:
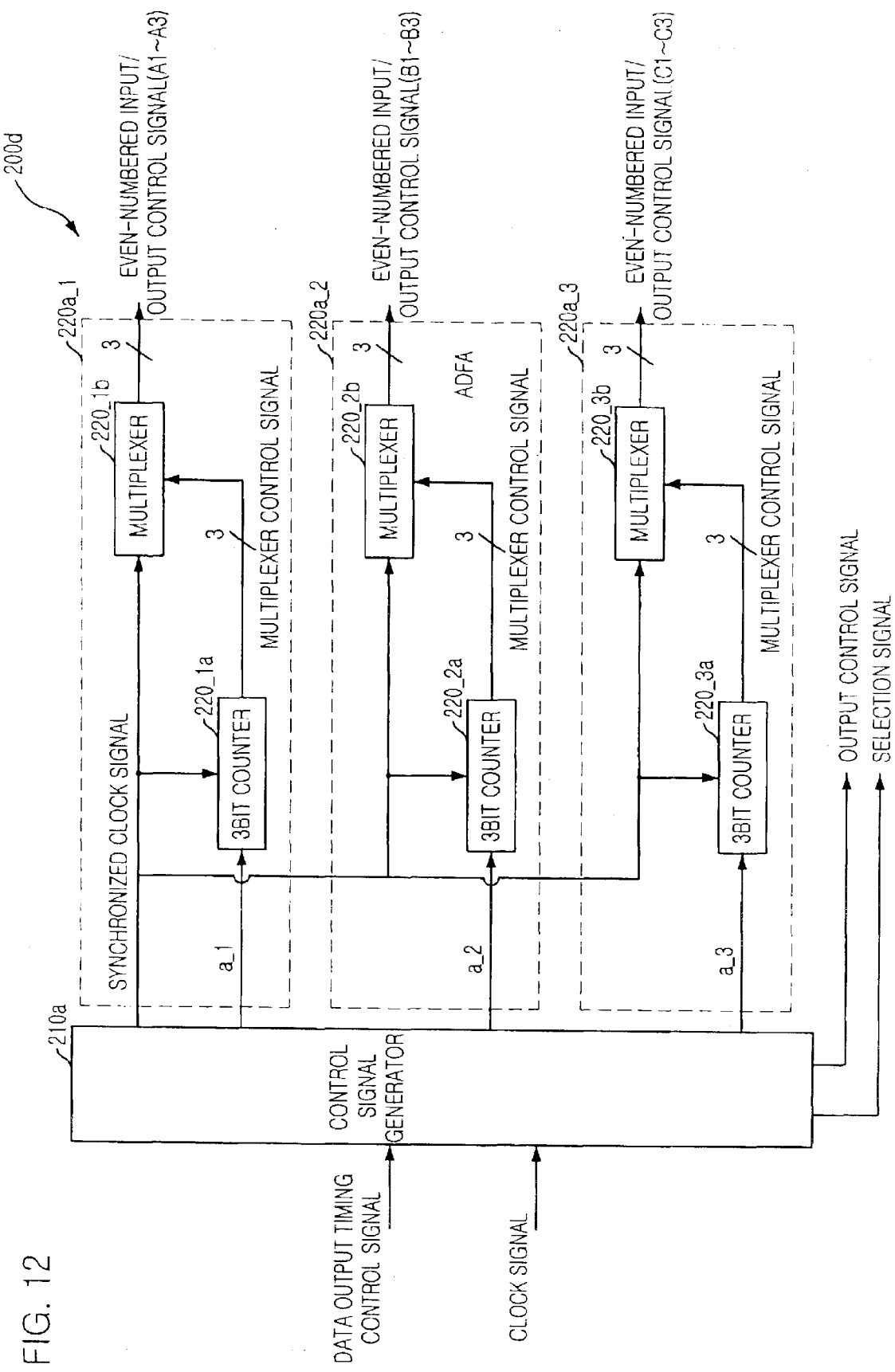
FIG. 12 is a block diagram of the controller for the pipe latch circuit shown on FIG. 10.

FIG. 12 is a block diagram of the pipe latch circuit controller shown on FIG. 10.

With reference to FIG. 12, the pipe latch circuit controller 200$d$ comprises a control signal generator 210$a$ for delivering clock signals and initialization signals a$\_1$, a$\_2$, a$\_3$ to each of the serial pipe latch controllers 220$a\_1$, 220$a\_2$, 220$a\_3$ when enabled by data output timing signals and for generating output control signals and selection signals for delivery to the output multiplexer 80$\_1$, 3 serial pipe latch controllers 220$a\_1$, 220$a\_2$, 220$a\_3$ for outputting 3 even-numbered input/output control signals A1~A3, B1~B3, C1~C3 using the synchronized clock signals when enabled by the initialization signals a$\_1$, a$\_2$, a$\_3$, and 3 serial pipe latch controllers (not shown) for outputting 3 odd-numbered input/output control signals using the synchronized clock signals when enabled by the initialization signals. The 3 serial pipe latch controllers for outputting odd-numbered input/output control signals (1~D3, E1~E3, F1~F3 were omitted in the drawing.

A serial pipe latch controller (for example, 220$a\_1$) consists of a 3-bit counter (20$a\_1a$ for counting synchronized clock signals when enabled by an initialization signal a__1, and a multiplexer 220a__1b for generating 3 even-numbered input/output control signals A1~A3 by selectively outputting synchronized clock signals in response to the 3 multiplexer control signals outputted from the counter 220a__1a.

Figure 13:
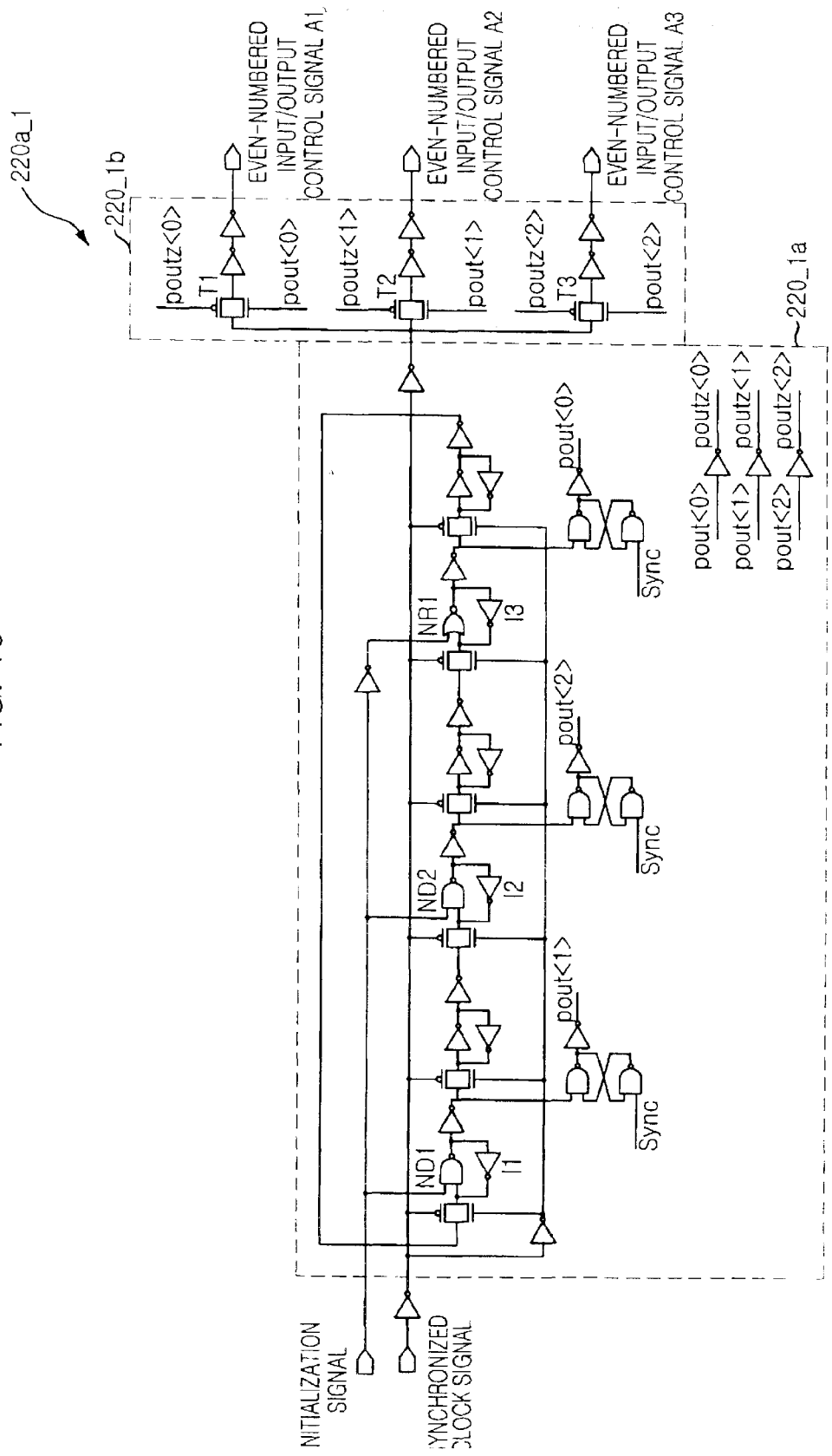
FIG. 13 is a circuit diagram of the pipe latch circuit controller shown on FIG. 12.

FIG. 13 is a circuit diagram of one of the 6 serial pipe latch controllers 220a__1 shown on FIG. 12.

In FIG. 13, the 3-bit counter 220__1a is first reset by an initialization signal, counts received synchronized clock signals, and then outputs first through third signals pout<0>~pout<2>. If the initialization signal changes to a high level, the NAND gates ND1, ND2 and the NOR gate NR1 function as an inverter, and form latches together with corresponding inverters I1, I2, I3.

When the 3-bit counter 220__1a has been enabled by the initialization signal, the 3-bit counter 220__1a sequentially outputs first signal pout<0> through third signal pout<2> to the multiplexer 220__1b as it counts the received synchronized clock signals sync.

The multiplexer 220__1b sequentially turns on each transfer gate T1~T3 in response to the sequentially received first signal pout<0> through third signal pout<2>, which causes the synchronized clock signals sync to be outputted as the even-numbered input/output control signals A1~A3.

Figure 14:
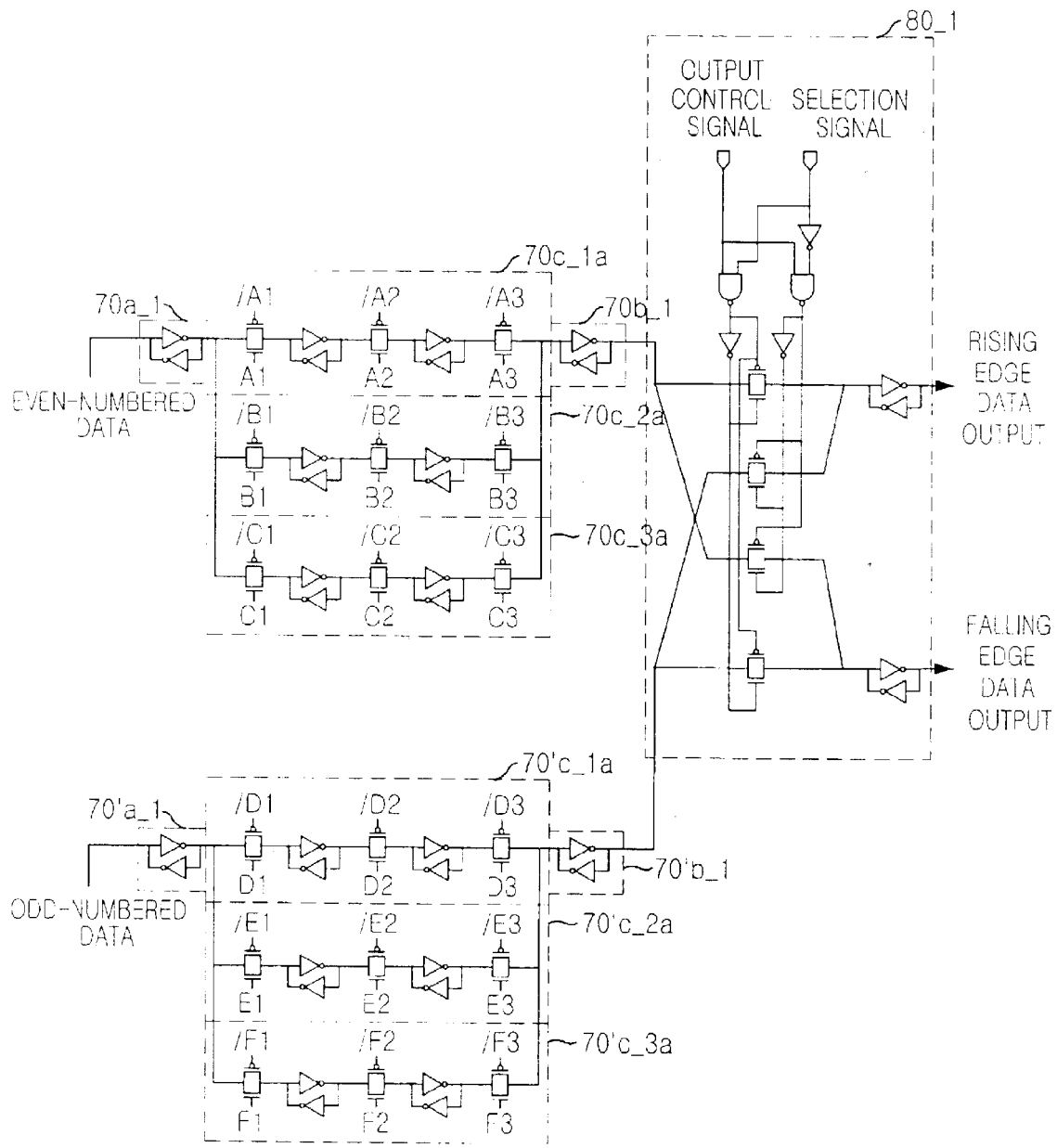
FIG. 14 is a circuit diagram of the pipe latch circuit shown on FIG. 10.

FIG. 14 is a circuit diagram of an embodiment of a pipe latch circuit shown on FIG. 10 using 2 inverters each to form registers and transfer gates to form path circuits. For ease of understanding, the same reference numbers used in FIG. 10 are used in the following.

With reference to FIG. 14, the even-numbered data from the cell area are latched in the input register 70a__1, and then passed to the serial pipe latch 70c__1a in response to the sequentially received even-numbered input/output control signals A1~A3. Subsequently, the next even-numbered data from the cell area are latched in the input register 70a__1 and delivered to another serial pipe latch 70c__2a in response to another set of sequentially received even-numbered input/output control signals B1~B3. Likewise, the next even-numbered data are delivered to the serial pipe latch 70c__3a in response to another set of sequentially received even-numbered input/output control signals C1~C3.

Subsequently, the linkage register 70b__1 delivers the data outputted from the serial pipe latches 70c__1a, 70c__2a, 70c__3a to the multiplexer 80__1. The transport path of odd-numbered data is the same as that of even-numbered data, and its explanation is omitted.

The multiplexer 80__1 selects the data latched in the linkage registers 70b__1, 70'b__1 as rising edge data or falling edge data, and outputs them in response to the output control signals.

Figure 15:
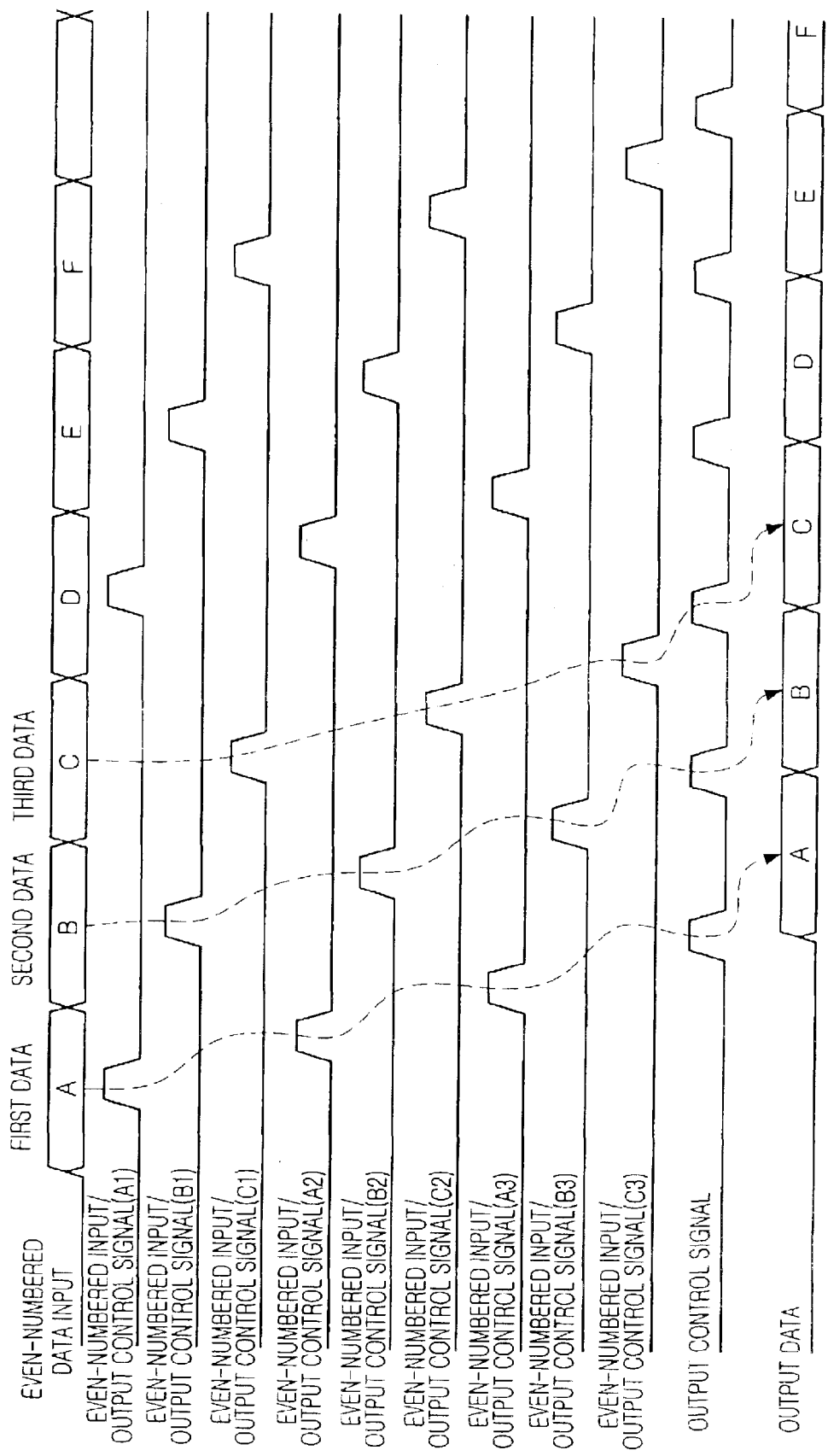
FIG. 15 is a waveform diagram showing the operation of the serial pipe latch circuit shown on FIG. 10.

FIG. 15 is a waveform diagram showing the input and output process of even-numbered data, during operation of the pipe latch circuit shown on FIG. 10. The waveform diagram showing the operation of pipe latch circuit for odd-numbered data is omitted because it is the same as that of even-numbered data.

In FIG. 15, even-numbered input/output control signals A1~A3 are outputted from the serial pipe latch controller 220a__1, even-numbered input/output control signals B1~B3 are outputted from the serial pipe latch controller 220a__2, and even-numbered input/output control signals C1~C3 are outputted from the serial pipe latch controller 220a__3.

In FIG. 15, the even-numbered data A, B, C are received from the cell area sequentially, and stored in the 6 registers in the serial pipe latch 70c__1a, 70c__2a, 70c__3a, linkage register 70b__1, and input register 70a__1, in response to the 9 even-numbered input/output control signals A1~A3, B1~B3, C1~C3 outputted from the pipe latch circuit controller (200d) at appropriate timings.

The even-numbered data stored in the linkage register 70b__1 are selected as rising edge data or falling edge data according to the selection signal outputted from the pipe latch circuit controller 200d, and are outputted to external circuits through the output buffer in response to output control signals.

Therefore, high speed data input is possible because when a first even-numbered data A is delivered from the first input register 70a__1 to one of the 3 serial pipe latches (for example, 70c__1a), even before the first data is delivered to the register at the next stage, the first input register can receive a second even-numbered data B from the cell area and deliver it to another serial pipe latch (for example, 70c__2a). In other words, high frequency operation is possible.

Although the technical concept of the present invention has been described in detail in connection with preferred embodiments, it should be understood that the embodiments are for explanatory purpose only and should not be interpreted to limit the scope of the claim. Also, it is obvious that various modifications, additions and alterations may be made to the invention by those skilled in the art without departing from the spirit and scope of the invention as defined in the appended claims.

What is claimed is:

1. A pipe latch circuit for storing a plurality of sequentially received first data and second data and outputting them as rising edge output data or falling edge output data, comprising:

a first input register for receiving said first data;

a plurality of first serial pipe latches comprising a plurality of registers connected in series, for selectively storing outputs from said first input register and selectively outputting them;

a first linkage register for storing data outputted from said plurality of first serial pipe latches;

a second input register for receiving said second data;

a plurality of second serial pipe latches comprising a plurality of registers connected in series, for selectively storing outputs from said second input register and selectively outputting them;

a second linkage register for storing data outputted from said plurality of second serial pipe latches;

a multiplexer for selecting data stored in said first linkage register and said second linkage register as rising edge output data or falling edge output data, and outputting them; and a pipe latch circuit controller for controlling said plurality of first and second serial pipe latches and said multiplexer.

2. The pipe latch circuit as recited in claim 1, wherein said first serial pipe latch includes:

a first path circuit for delivering data outputted from said first input register;

a plurality of registers connected in series, for sequentially delivering data received from said first path circuit;

a plurality of second path circuits provided between said plurality of registers connected in series, for delivering data stored in a register at preceding stage to a register at subsequent stage; and a third path circuit for delivering data stored in the register at the final stage of said plurality of registers connected in series to said first linkage register.

3. The pipe latch circuit as recited in claim 2, wherein said pipe latch circuit controller includes:

a control signal generator for delivering received clock signals when enabled by data output enable signals, and outputting a plurality of initialization signals as enabled sequentially at each period of said clock signals; and a plurality of serial pipe latch controllers for receiving said clock signals when enabled by one of said plurality of initialization signals, and sequentially turning on first path circuit through third path circuit provided at said plurality of first serial pipe latches.

4. The pipe latch circuit as recited in claim 3, wherein said serial pipe latch controller includes:

means for counting said clock signals for as many times as total number of first, second and third path circuits provided at said serial pipe latch, when enabled by selected initialization signals; and a multiplexer for outputting a plurality of input/output control signals that sequentially turn on first, second and third path circuits provided at said serial pipe latch, in response to said counted clock signals.

5. The pipe latch circuit as recited in claim 4, wherein said first and second input registers includes an inverting latch using 2 inverters.

6. A pipe latch circuit as recited in claim 4, wherein said first and second linkage registers includes an inverting latch using 2 inverters.

* * * * *